(12) United States Patent
Philipp

(10) Patent No.: US 10,306,758 B2
(45) Date of Patent: May 28, 2019

(54) ENHANCED CONDUCTORS

(75) Inventor: Harald Philipp, Hamble (GB)

(73) Assignee: Atmel Corporation, Chandler, AZ (US)

( * ) Notice: Subject to any disclaimer, the term of this patent is extended or adjusted under 35 U.S.C. 154(b) by 1048 days.

(21) Appl. No.: 12/838,181

(22) Filed: Jul. 16, 2010

(65) Prior Publication Data

US 2012/0013545 A1 Jan. 19, 2012

(51) Int. Cl.
*H05K 1/11* (2006.01)
*G06F 3/041* (2006.01)
*H05K 1/09* (2006.01)

(52) U.S. Cl.
CPC ............... *H05K 1/11* (2013.01); *G06F 3/041* (2013.01); *G06F 2203/04103* (2013.01); *H05K 1/09* (2013.01); *H05K 2201/0326* (2013.01); *H05K 2201/0329* (2013.01); *H05K 2201/0373* (2013.01)

(58) Field of Classification Search
CPC ...... G06F 3/041; G06F 3/0412; G06F 3/0416; G06F 3/044; G06F 3/047; G06F 2203/04103; G06F 2203/04112; H05K 1/0274; H05K 1/0296; H05K 1/0298; H05K 1/09; H05K 1/11; H05K 1/118; H05K 2201/0326; H05K 2201/0329; H05K 2201/0341; H05K 2201/0355; H05K 2201/0373
USPC ...................... 345/173–178; 178/18.01–18.09
See application file for complete search history.

(56) References Cited

U.S. PATENT DOCUMENTS

| | | | |
|---|---|---|---|
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2003/0234770 A1* | 12/2003 | MacKey | G06F 3/044 345/173 |
| 2005/0156906 A1* | 7/2005 | Chiu et al. | 345/173 |
| 2007/0074316 A1* | 3/2007 | Alden | B82Y 20/00 257/784 |
| 2007/0298253 A1* | 12/2007 | Hata | B82Y 10/00 428/339 |
| 2008/0259262 A1* | 10/2008 | Jones | B82Y 10/00 349/139 |
| 2009/0129004 A1* | 5/2009 | Gruner | H01L 31/022466 361/679.21 |

(Continued)

FOREIGN PATENT DOCUMENTS

| | | | | |
|---|---|---|---|---|
| JP | WO2006030981 | * | 3/2006 | ............. H01B 13/00 |
| WO | WO 2012/129247 | | 9/2012 | |

OTHER PUBLICATIONS

"The Impact of Nanotechnology on Energy." Kirk Hermann, 1 L. & Bus. 242 (2004)).*

(Continued)

*Primary Examiner* — Nathan Danielsen
(74) *Attorney, Agent, or Firm* — Baker Botts L.L.P.

(57) ABSTRACT

Disclosed examples of electrode structures and methods of manufacture thereof may provide one or more advantages relating to enhanced conductivity, for example, while providing optically clear conductors.

21 Claims, 4 Drawing Sheets

(56) References Cited

U.S. PATENT DOCUMENTS

| | | | | |
|---|---|---|---|---|
| 2009/0194344 A1* | 8/2009 | Harley | ............... | G06F 3/044 178/18.06 |
| 2009/0315854 A1 | 12/2009 | Matsuo | | |
| 2010/0079384 A1* | 4/2010 | Grivna | ............... | 345/173 |
| 2010/0164900 A1* | 7/2010 | Lin | ............... | 345/174 |
| 2011/0210939 A1* | 9/2011 | Reynolds | ............... | G06F 3/0418 345/174 |
| 2011/0260741 A1* | 10/2011 | Weaver | ............... | G06F 3/0418 324/686 |
| 2011/0310037 A1* | 12/2011 | Moran | ............... | G06F 3/0412 345/173 |
| 2012/0242588 A1 | 9/2012 | Myers | | |
| 2012/0242592 A1 | 9/2012 | Rothkopf | | |
| 2012/0243151 A1 | 9/2012 | Lynch | | |
| 2012/0243719 A1 | 9/2012 | Franklin | | |
| 2013/0076612 A1 | 3/2013 | Myers | | |

OTHER PUBLICATIONS

News, New Silver Conductive Inks Target High-Growth Touch Screen and OLED Markets, DuPont Microcircuit Materials Expands Innovative Offerings for Printed Electronics, Research Triangle Park, N.C., Apr. 13, 2010, Printed from website: http://www2dupont.com/MCM/en_US/news_events/article20100413.html on Apr. 20, 2010.

Cambrios Technologies Corporation Awarded Department of Defense Contract for Flexible Solar Cells, Sunnyvale, CA, Apr. 12, 2010, Cambrios Technologies Corp., Printed from website: http://www.cambrios.com/200/DOD_Release.htm on Apr. 20, 2010.

Horteis et al., "Fine Line Printed and Plated Contacts on High Ohmic Emitters Enabling 20% Cell Efficiency," Fraunhofer Institute for Solar Energy Systems, IEEE (2009).

Core Applications & Technologies, Printing of Antennas and Flexible Circuits, Conductive InkJet Technology Ltd. (2009).

Latest News, Conductive InkJet Technology, Printed from Website: http://www.conductiveinkjet.com/about-us/latest-news/2009.aspx on Apr. 20, 2010.

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

ENHANCED CONDUCTORS

BACKGROUND

A position sensor is a device that can detect the presence and location of a touch, by a user's finger or by an object, such as a stylus, for example, within a display area of the position sensor overlaid on a display screen. In a touch sensitive display application, the position sensor enables a user to interact directly with what is displayed on the screen, rather than indirectly with a mouse or touchpad. Position sensors can be attached to or provided as part of computers, personal digital assistants (PDA), satellite navigation devices, mobile telephones, portable media players, portable game consoles, public information kiosks, and point of sale systems etc. Position sensors have also been used as control panels on various appliances.

There are a number of different types of position sensors/touch screens, such as resistive touch screens, surface acoustic wave touch screens, capacitive touch screens etc. A capacitive touch screen, for example, may include an insulator, coated with a transparent conductor in a particular pattern. When an object, such as a user's finger or a stylus, touches or is provided in close proximity to the surface of the screen there is a change in capacitance. This change in capacitance is sent to a controller for processing to determine the position of the touch on the screen.

In recent years, touch sensitive position sensors have used PEDOT (Poly(3,4-ethylenedioxythiophene)) which is a conducting polymer.

SUMMARY

The following disclosure describes examples of electrode structures and methods of manufacture thereof that may provide one or more advantages relating to enhanced conductivity, for example, while providing optically clear conductors.

BRIEF DESCRIPTION OF THE DRAWINGS

The drawing figures depict one or more implementations in accordance with the present teachings, by way of example only, not by way of limitation. In the figures, like reference numerals refer to the same or similar elements.

DETAILED DESCRIPTION

In the following detailed description, numerous specific details are set forth by way of examples in order to illustrate the relevant teachings. In order to avoid unnecessarily obscuring aspects of the present teachings, those methods, procedures, components, and/or circuitry that are well-known to one of ordinary skill in the art have been described at a relatively high-level.

In the illustrated examples, enhanced conductors are provided for a touch position sensor. Applications to other conductors are discussed later.

Figure 1:
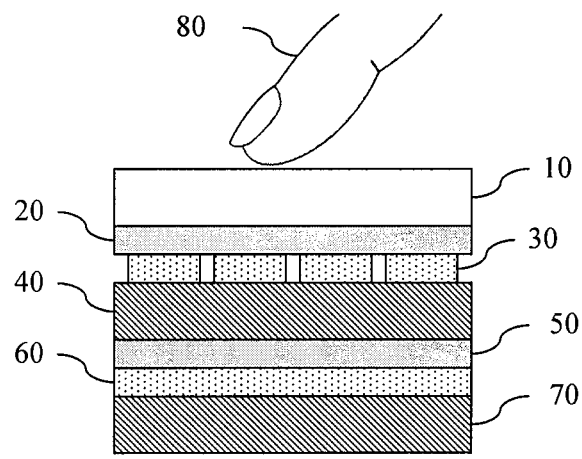
FIG. 1 illustrates schematically a side view of a touch sensitive screen.

Reference now is made in detail to the examples illustrated in the accompanying figures and discussed below. FIG. 1 illustrates a side view of a touch sensitive screen. The touch sensitive screen of FIG. 1 is made up of a transparent panel 10, a first adhesive layer 20, a light transmissive conductive electrode layer 30, a first insulating substrate 40, a second adhesive layer 50, a second light transmissive conductive electrode layer 60, and a second insulating substrate 70.

The first conductive electrode layer 30 includes a plurality of first electrodes and the second conductive electrode layer 60 includes a plurality of second electrodes. A plurality of nodes are formed at the intersections of the first electrodes and the second electrodes. The first and second electrodes can be configured to form any particular pattern as desired. In FIG. 1, the second electrodes are arranged perpendicular to the first electrodes such that only the side of one of the second electrodes is visible in the side view.

In one example, the transparent panel 10 is made of a resilient, transparent material suitable for repeated touching. Examples of the transparent material include glass, Polycarbonate or PMMA (poly(methyl methacrylate)). In one example, the first and second adhesive layers 20, 50 are made of any optically clear adhesive suitable for use in a touch panel. In one example, the first and second substrates 40, 70 are transparent materials, such as PET (polyethylene terephthalate), Polycarbonate, or glass.

In one example, the first and second conductive electrodes 30, 60 are made of PEDOT. In another example, the first and second conductive electrodes 30, 60 are made of an indium tin oxide (ITO). For at least some applications, such as position sensors having a large sensing area, which may require long electrodes, it may be useful to increase the conductivity of PEDOT or ITO. However, many techniques to increase conductivity of the transparent electrode material reduce the transparency of the material.

In an application with a display, the touch screen of FIG. 1 would be mounted over the exterior of the display device, for example, with the substrate 70 adjacent to the display device (not shown). The display may be of any type known to the skilled person, such as a liquid crystal (for example, active matrix liquid crystal), electroluminescent, electrophoretic (e-ink), plasma, or cathode-ray display. By way of example, in the illustrated orientation, the substrate 70 would be on top of the output surface of the display device. It will be appreciated that light emitted from the display must be able to pass through the position sensing panel in order to be visible to a user. Therefore, elements of the layer stack in aggregate are substantially transparent. Light produced or reflected from the display device, representing displayed information, passes through the elements of the layer stack (upward in the exemplary orientation) for observation of the information by a user. The user may touch the panel 10, as shown at 80, to provide input such as to select from the information shown on the display. To make this possible, the first and second conductive electrodes 30, 60 are made from an optically clear conductive material so as to appear transparent to the user during operation of the device, e.g. during operation of a touch sensitive display.

In order to produce an enhanced conductor suitable for use as the first and second conductive electrodes 30, 60, conductive micro scale traces are deposited onto a substrate, such as substrates 40, 70. A layer of an optically clear conductive material, such as PEDOT or ITO, is then provided over the conductive micro scale traces (CMSTs). The conductive material has good optical performance. The CMSTs are of a substance, e.g. a metal, that is more conductive than the conductive material. For example, the conductive CMSTs may be formed of highly conductive metal, such as silver, gold, copper, etc.

Figure 2:
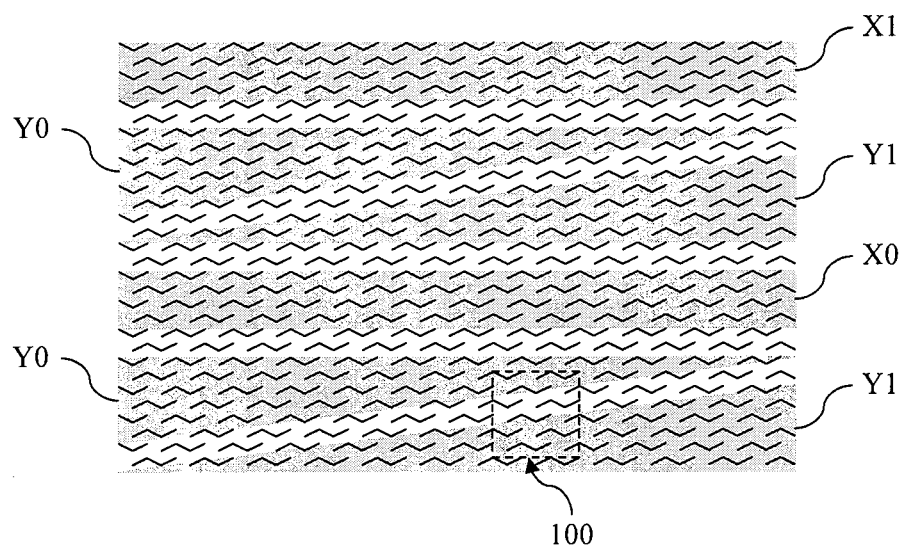
FIG. 2 illustrates schematically one example of enhanced conductors for a touch sensitive screen.
Figure 3:
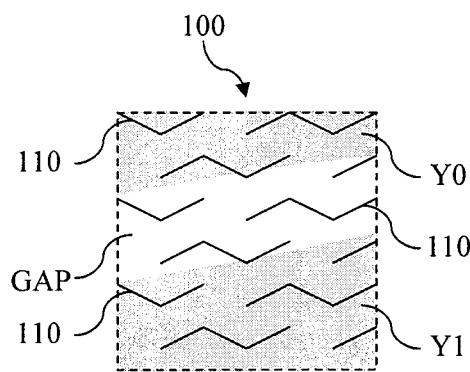
FIG. 3 illustrates schematically a magnified area of the enhanced conductors of FIG. 2.

FIG. 2 illustrates one example of enhanced conductors for a touch sensitive screen. FIG. 3 illustrates schematically a magnification of area 100 of the enhanced conductors of FIG. 2. As illustrated in FIGS. 2 and 3, CMSTs 110 are provided over the entire area of the substrate. For a given conductor, a material contacts a number of the CMSTs. In this example, the material is printed on top of the CMSTs 110 in the electrode pattern X0, X1, Y0, Y1. Examples are also discussed in which the CMSTs are printed on the conductive material. As stated above, the first and second electrodes can be configured to form any particular pattern as desired. In FIGS. 2 and 3, the first and second electrodes are printed on the same substrate. However, the X and Y electrodes may be printed on separate substrates as in the example of FIG. 1.

The CMSTs 110 enhance the conductivity of the conductive material by providing highly conductive paths which short circuit the conductive material locally on a micro scale (10's of microns). The CMSTs 110 increase the conductivity of the electrodes by creating a shorting path within each electrode. Increased conductivity may be particularly beneficial in large area position sensing panels that have long electrodes. Increased conductivity, for example, may offer one or more of the following advantages: to improve response time by providing for shorter RC time constants and thus offer faster settling times, or to enhance blocking of electrical noise from the underlying display to improve signal to noise ratio, etc.

The CMSTs 110 are distributed on the substrate in a predetermined pattern, such that the CMSTs 110 do not touch one another. In addition, the CMSTs 110 have a size such that a CMST 110 does not span between two electrodes across the gap shown in FIG. 3. By their design size and geometry, the CMSTs 110 are intended to be invisible or virtually invisible to the human eye during device operation.

The CMSTs 110 may have a line width of no more than 15 microns. In a specific example, the CMSTs 110 have a line width of no more than 10 microns. In another example, the CMSTs 110 have a line width of between approximately 5 to 15 μm.

The CMSTs 110 may have length of no more than 100 microns. In a specific example, the CMSTs 110 have a length of no more than 50 microns. In another example, the CMSTs 110 have a length between approximately 20 to 100 μm.

The exemplary touch screen electrodes are electrically isolated from each other. Hence, in the examples, the CMSTs 110 have length capable of providing a shorting path within each electrode area, but not so long as to create a shorting path between electrodes, so that the CMSTs 110 do not short circuit across adjacent electrodes formed by the patterned conductive material. For example, the CMSTs 110 have length that is less than the gap between the Y0 and Y1 electrodes as shown in FIG. 3, and less than the gap between the Y0 and X0 electrodes (FIG. 4) etc.

In the examples, in order to avoid the CMSTs 110 creating a short circuit path between two electrodes, the gap between adjacent electrodes is at least as large as the length of the CMSTs 110. Alternatively or additionally, the process of depositing the electrodes may entail registration of the electrodes with the CMSTs so as to avoid any creation of short circuits between electrodes.

The CMSTs 110 may have substantially the same length and/or width. Alternatively, the CMSTs 110 may have differing lengths and/or widths.

In a panel 10 that is intended to be transparent, for example, no more than 10%, or no more than 5%, of the substrate area is covered by the CMSTs 110 such that most of the light emitted from a display or other light source underlying the position sensing panel may pass through the panel.

In the examples, the CMSTs 110 are aligned in the direction of the electrodes shapes to further enhance conductivity of the electrodes.

Figure 4:
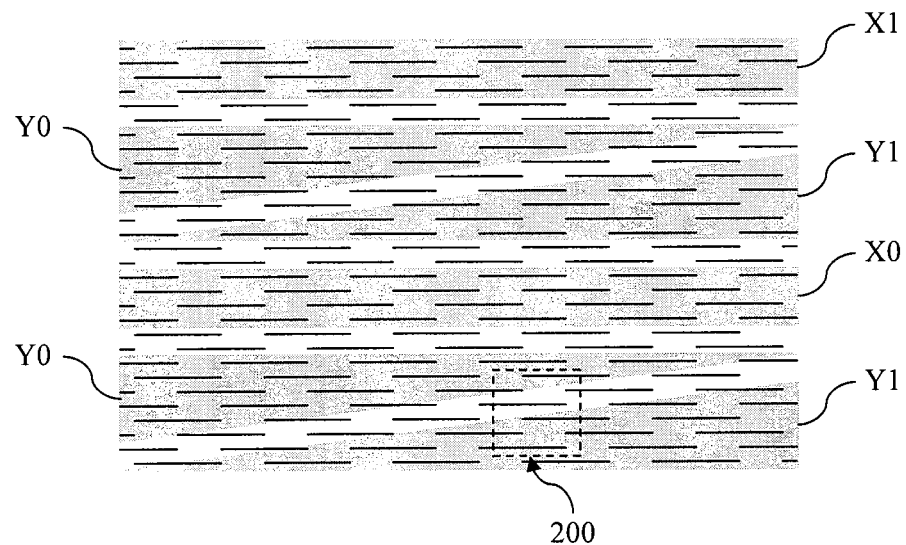
FIG. 4 illustrates schematically another example of enhanced conductors for a touch sensitive screen.
Figure 5:
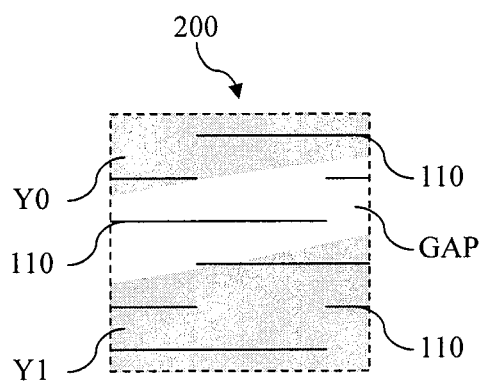
FIG. 5 illustrates schematically a magnified area of the enhanced conductors of FIG. 4.

The CMSTs 110 of FIGS. 2 and 3 are formed into a zigzag shape. Zigzag shapes provide a degree of optical moiré suppression with respect to the pixels of the underlying display, while their effectively greater lateral widths provide for enhanced conductivity over straight line segments. FIGS. 4 and 5 illustrate another example, of enhanced conductors for a touch sensitive screen. In FIGS. 4 and 5 the CMSTs 110 are straight lines. Straight lines potentially allow for narrower gaps between electrodes over zigzag lines, which in turn may be of benefit in decreasing electrical noise penetration while decreasing the visibility of the electrode outlines.

Printing the CMSTs 110 over the entire area of the substrate avoids any need for alignment between the CMSTs 110 and the conductive material when printing the conductive material. This provides simpler processing and increased yields.

Figure 6:
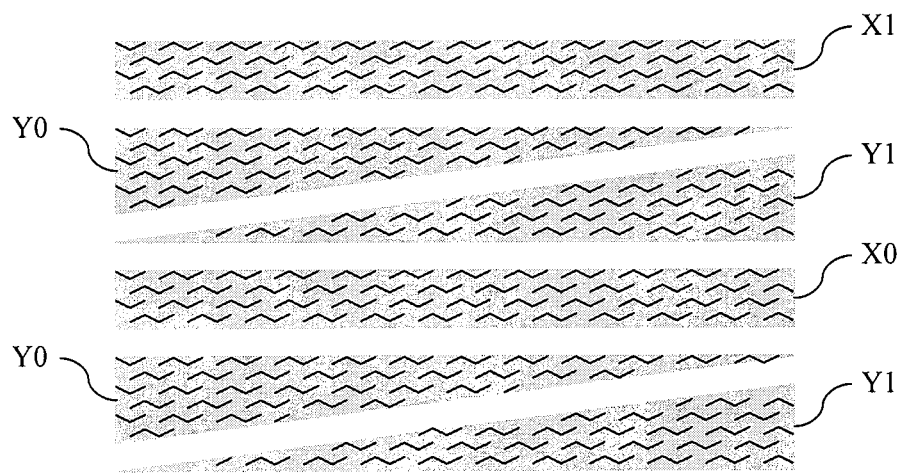
FIG. 6 illustrates schematically another example of enhanced conductors for a touch sensitive screen.
Figure 7:
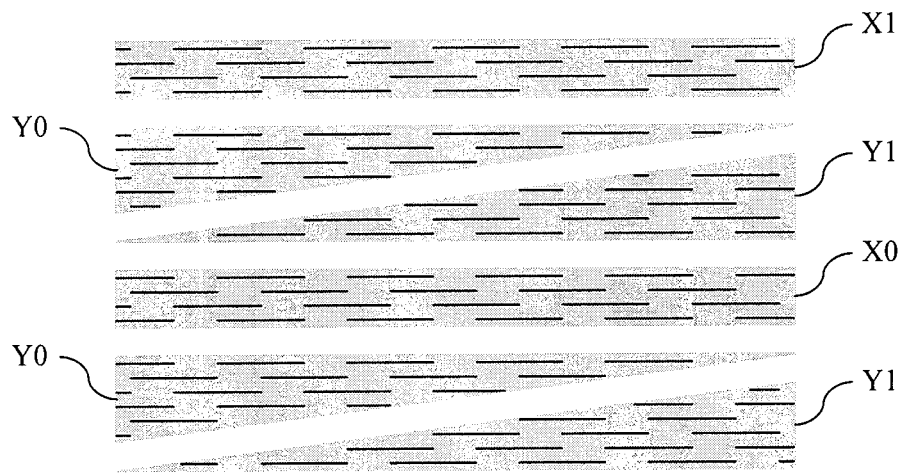
FIG. 7 illustrates schematically another example of enhanced conductors for a touch sensitive screen.

In another example, the CMSTs 110 are only provided on the substrate in the areas which are going to be printed with the conductive material, as illustrated in FIGS. 6 and 7. Currently, printing techniques have alignment errors of between 50 to 100 μm. Therefore, it increases costs to print the CMSTs 110 only in the areas which are going to be printed with the conductive material. However, as printing accuracy increases the cost will decrease. With this approach, it may be possible to decrease the gaps between electrodes without creating short circuits between them, which allows for an increase in electrode surface area thereby decreasing the visibility of the gaps to the user, as both ITO and PEDOT materials for instance have some residual visibility which can be principally observed as a contrast between printed and unprinted areas.

The CMSTs 110 increase the conductivity of the conductive material. Therefore, the conductive material can be selected based on optimum optical characteristics without a reduction in electrode conductivity.

Figure 8:
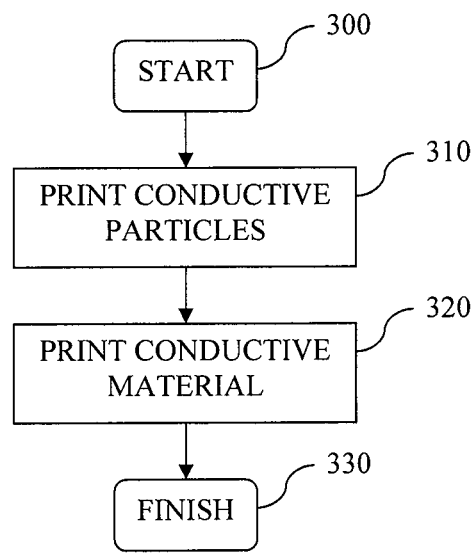
FIG. 8 illustrates a flow chart depicting an example of a process for producing the enhanced conductors.

FIG. 8 illustrates a process for producing the conductive electrodes. At step 300 the process begins. At step 310 the CMSTs are printed onto a substrate. In one example, the CMSTs are provided across the entire area of the substrate. In another example, the CMSTs are provided in a predetermined pattern. At step 320 the conductive material is printed onto the substrate and the CMSTs. In one example, the conductive material is provided in a predetermined pattern forming the electrodes. At step 330 the process ends.

Figure 9:
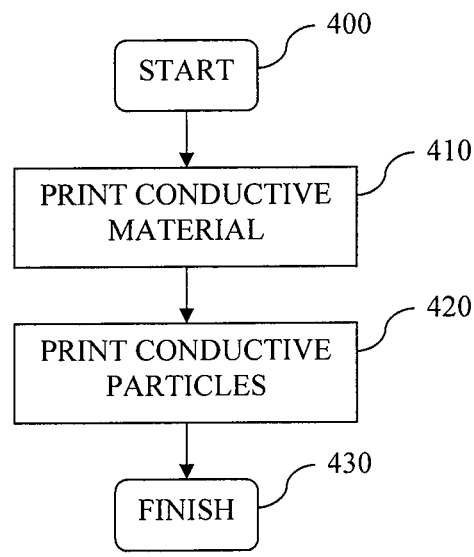
FIG. 9 illustrates another flow chart depicting an example of a process for producing the enhanced conductors.

In FIG. 9, steps 310 and 320 are reversed. In this example, the conductive material is printed onto the substrate at step 410 in the desired electrode pattern. Then the CMSTs are printed onto the conductive material at step 420. In one example, the CMSTs are printed onto the conductive material and the substrate.

The process of FIGS. 8 and 9 may be performed using known printing techniques. Further assembly steps (not shown) may include laminating the material layers to each other and to an overlying panel using a clear adhesive, connecting a connection 'tail', testing, and so on.

Although the enhanced conductors are described above with reference to touch sensitive screens, the process of FIGS. 8 and 9 can be applied to all manner of printed conductors which need conductivity enhancement, whether clear, translucent, or opaque. For example, the electrode pattern may be used as a field emission layer for a touch screen or an EL lamp.

Various modifications may be made to the examples and embodiments described in the foregoing, and any related teachings may be applied in numerous applications, only some of which have been described herein. It is intended by the following claims to claim any and all applications, modifications and variations that fall within the true scope of the present teachings.

The invention claimed is:

1. A touch sensitive screen comprising:
   an insulating substrate;
   conductive micro scale traces provided across an area of the substrate; and
   a layer of conductive material patterned to form electrodes for touch sensing, the conductive material of each electrode contacting a plurality of the conductive micro scale traces, the conductive micro scale traces provided across the area of the substrate being between the substrate and the layer of conductive material patterned to form electrodes for touch sensing,
   wherein:
      the conductive micro scale traces are more conductive than the conductive material;
      the conductive micro scale traces have a length less than a gap between adjacent electrodes; and
      one or more of the conductive micro scale traces extends from the conductive material of one of the adjacent electrodes into the gap between the adjacent electrodes.

2. The touch sensitive screen of claim 1, further comprising:
   a second insulating substrate provided adjacent the layer of conductive material;
   second conductive micro scale traces provided across an area of the second substrate; and
   a second layer of conductive material, wherein the second layer of conductive material is patterned to form second electrodes and the conductive material of each second electrode contacts a plurality of the second conductive micro scale traces.

3. The touch sensitive screen of claim 1, wherein the conductive micro scale traces are aligned in the direction of the electrodes.

4. The touch sensitive screen of claim 1, wherein the conductive micro scale traces do not contact one another.

5. The touch sensitive screen of claim 1, wherein the conductive material comprises an optically clear conductive material.

6. The touch sensitive screen of claim 1, wherein the conductive material comprises a conductive polymer.

7. The touch sensitive screen of claim 6, wherein the conductive polymer comprises Poly(3,4-ethylenedioxythiophene) (PEDOT).

8. The touch sensitive screen of claim 6, wherein the conductive polymer comprises indium tin oxide (ITO).

9. The touch sensitive screen of claim 1, wherein the conductive micro scale traces comprise one or more of the following:
   silver;
   gold;
   and copper.

10. The touch sensitive screen of claim 1, wherein the conductive micro scale traces are substantially invisible to the human eye.

11. The touch sensitive screen of claim 1, wherein the conductive micro scale traces have a width of no more than 15 µm.

12. The touch sensitive screen of claim 11, wherein the conductive micro scale traces have a line width of at least 5 µm.

13. The touch sensitive screen of claim 1, wherein the conductive micro scale traces have a length of no more than 100 µm.

14. The touch sensitive screen of claim 13, wherein the conductive micro scale traces have a length of at least 20 µm.

15. The touch sensitive screen of claim 1, wherein the conductive micro scale traces have one or more of substantially the same length and line width.

16. The touch sensitive screen of claim 1, wherein the conductive micro scale traces are provided on the substrate in the area and covered with the conductive material.

17. A process for producing conductive electrodes, comprising the steps of:
   printing conductive micro scale traces onto a substrate; and
   printing a conductive material over the substrate and the conductive micro scale traces in a pattern to form the conductive electrodes, the conductive material of each electrode contacting a plurality of the conductive micro scale traces, the conductive micro scale traces provided across the area of the substrate being between the substrate and the layer of conductive material patterned to form electrodes for touch sensing,
   wherein:
      the conductive micro scale traces are more conductive than the conductive material; and
      the conductive micro scale traces have a length less than a gap between adjacent electrodes; and
      one or more of the conductive micro scale traces extends from the conductive material of one of the adjacent electrodes into the gap between the adjacent electrodes.

18. The process of claim 17, wherein the conductive micro scale traces are provided across the entire area of the substrate.

19. The process of claim 17, wherein the conductive micro scale traces are provided in a predetermined pattern on the substrate.

20. The process of claim 17, wherein the conductive material is provided in a predetermined pattern of first electrodes and second electrodes across the substrate.

21. A process for producing conductive electrodes, comprising the steps of:
   printing a conductive material over a substrate in a pattern for the electrodes; and
   printing conductive micro scale traces over the substrate, including a plurality of the micro scale traces on the conductive material for each of the electrodes, wherein:
      the conductive micro scale traces are more conductive than the conductive material;

the conductive micro scale traces have a length less than a gap between adjacent electrodes; and one or more of the conductive micro scale traces extends from the conductive material of one of the adjacent electrodes into the gap between the adjacent electrodes.

\* \* \* \* \*